(12) United States Patent
Green et al.

(10) Patent No.: US 11,486,037 B2
(45) Date of Patent: Nov. 1, 2022

(54) SYNTHESIS OF THICK SINGLE CRYSTAL DIAMOND MATERIAL VIA CHEMICAL VAPOUR DEPOSITION

(71) Applicant: ELEMENT SIX TECHNOLOGIES LIMITED, Didcot (GB)

(72) Inventors: Ben Llewelyn Green, Didcot (GB); Andrew Michael Bennett, Didcot (GB); Timothy Peter Mollart, Didcot (GB); Stefan Ian Olsson Robbie, Didcot (GB)

(73) Assignee: Element Six Technologies Limited, Didcot (GB)

( * ) Notice: Subject to any disclaimer, the term of this patent is extended or adjusted under 35 U.S.C. 154(b) by 209 days.

(21) Appl. No.: 16/345,946

(22) PCT Filed: Nov. 8, 2017

(86) PCT No.: PCT/EP2017/078532
§ 371 (c)(1),
(2) Date: Apr. 29, 2019

(87) PCT Pub. No.: WO2018/087110
PCT Pub. Date: May 17, 2018

(65) Prior Publication Data
US 2020/0087782 A1   Mar. 19, 2020

(30) Foreign Application Priority Data
Nov. 10, 2016  (GB) ..................... 1619002

(51) Int. Cl.
C23C 16/27  (2006.01)
C30B 25/12  (2006.01)
(Continued)

(52) U.S. Cl.
CPC ............. *C23C 16/27* (2013.01); *C30B 25/12* (2013.01); *C30B 25/20* (2013.01); *C30B 29/04* (2013.01)

(58) Field of Classification Search
None
See application file for complete search history.

(56) References Cited

U.S. PATENT DOCUMENTS

| 7,740,824 B2 | 6/2010 | Godfried et al. |
| 2009/0239078 A1* | 9/2009 | Asmussen ............... C30B 25/08 428/408 |

FOREIGN PATENT DOCUMENTS

| WO | 2004027123 A1 | 4/2004 |
| WO | 2009114130 A2 | 9/2009 |

OTHER PUBLICATIONS

Nad, Shreya, et al., "Analyses of single crystal diamond substrates grown in a pocket substrate holder via MPACVD," Diamond & Related Materials, 2016, pp. 36-46, vol. 66, Elsevier B.V.
(Continued)

*Primary Examiner* — Guinever S Gregorio
(74) *Attorney, Agent, or Firm* — Kilpatrick Townsend & Stockton LLP

(57) ABSTRACT

A method of fabricating a plurality of single crystal CVD diamonds. The method includes mounting a plurality of single crystal diamond substrates on a first carrier substrate. The plurality of single crystal diamond substrates is subjected to a first CVD diamond growth process to form a plurality of single crystal CVD diamonds on the plurality of single crystal diamond substrates. The plurality of single crystal CVD diamonds are mounted in a recessed carrier substrate and subjected to a second CVD diamond growth process.

14 Claims, 2 Drawing Sheets

(51) Int. Cl.
*C30B 25/20* (2006.01)
*C30B 29/04* (2006.01)

(56) References Cited

OTHER PUBLICATIONS

Wu, G., et al., "The influence of recess depth and crystallographic orientation of seed sides on homoepitaxial growth of CVD single crystal diamonds," Diamond & Related Materials, 2016, pp. 144-151, vol. 65, Elsevier B.V.
United Kingdom Patent Application No. GB1619002.7, Combined Search and Examination Report dated May 12, 2017, 7 pages.
International Patent Application No. PCT/EP2017/078532, International Search Report and Written Opinion dated Dec. 20, 2017, 12 pages.
United Kingdom Patent Application No. GB1718433.4, Combined Search and Examination Report dated Apr. 27, 2018, 7 pages.

* cited by examiner

SYNTHESIS OF THICK SINGLE CRYSTAL DIAMOND MATERIAL VIA CHEMICAL VAPOUR DEPOSITION

FIELD

The present invention relates to the synthesis of single crystal chemical vapour deposited (CVD) diamond material and particularly to the synthesis of thick layers of single crystal CVD diamond material.

BACKGROUND

Single crystal CVD diamond products are limited by the available size of single crystal diamond growth substrates. The size of the end product is directly related to the size of the input substrate. Very small quantities of substrates are available at sizes approaching 10 mm×10 mm. In order to achieve >15 mm diameter single crystal CVD diamond products, a commercially viable method for producing larger single crystal diamond substrates is required.

In addition to a requirement for large single crystal diamond substrates and products, single crystal diamond substrates must also provide a growth surface that is sufficiently free from defects which would otherwise adversely affect the quality of the single crystal CVD diamond product material grown thereon. As such, single crystal diamond substrates should have a relatively low concentration of surface and sub-surface defects such as dislocations and inclusions which are intrinsic to the single crystal diamond substrate material and defects such as microcracks formed at the surface of the substrate during processing steps such as polishing to form a low roughness growth surface.

Although some lateral growth beyond that of the substrate size can occur during single crystal CVD diamond growth, the lateral size of a single crystal CVD diamond layer is still limited by the lateral dimensions of the substrate on which it is grown. One approach known in the art for producing larger area single crystal CVD diamond substrates and products is to grow a very thick layer of single crystal CVD diamond material. This thick layer of single crystal CVD diamond material may then be processed by vertically slicing the thick layer of single crystal CVD diamond material into large area plates which may be formed into product or used as substrates for further single crystal CVD diamond growth. Such an approach can lead to an increase is size of single crystal CVD diamond substrates and products. Furthermore, such an approach can be advantageous in minimizing defects at major surfaces of a product plate. This is because extended dislocation defects tend to propagate through a single crystal CVD diamond layer in the vertical growth direction. By vertically slicing a thick layer of material to extract a plate of material, the resultant plate will have dislocations extending in the plane of the plate with fewer dislocations intersecting the major faces of such a plate. As such, the plate can be used to provide a large area, low defect, growth surface for subsequent CVD diamond growth. Alternatively, such a plate can provide a low birefringence single crystal CVD diamond product, e.g. for optical applications.

The aforementioned approach is described in WO2004027123. In this regard, it may be noted that in a standard single crystal CVD synthesis process in which a single crystal diamond substrate is placed on a flat carrier substrate and subjected to CVD diamond growth, the thickness of the single crystal CVD diamond layer which can be grown thereon is limited by issues such as plasma stability, dimensional stability, and temperature control. This is particularly problematic as the single crystal CVD diamond layer grows upwards towards the overlying plasma such that the conditions at the diamond growth surface change during growth.

In order to alleviate this problem, WO2004027123 describes a multi-stage growth method. Example 4 of WO2004027123 describes such a process in which a single crystal CVD diamond substrate is grown on in stages, typically adding about 3 mm of growth in each stage. At the end of each stage the single crystal diamond layer is retained in the polycrystalline diamond layer that has grown around it, this polycrystalline layer being trimmed to a disc about 25 mm diameter using laser trimming, and then this disc mounted into a recessed tungsten or other metal disc such that the point where the single crystal is exposed above the polycrystalline diamond layer is approximately level (to within 0.3 mm) of the upper surface of the recessed disc. It is described that using this technique it is possible to grow layers with a final thickness in the range 10-18 mm, from which plates can be vertically cut. It is reported that plates were produced which were larger than 15 mm×12 mm.

The use of a recessed carrier substrate aids in maintaining control of the top surface of the diamond layer as the diamond grows into the plasma the thicker the diamond, the greater the loss of control. Recessing the diamond lowers the effective height of the diamond relative to the plasma and shields the four non-growth sides of the diamond, presenting only a single growth face to the plasma.

Nad & Asmussen (Diamond & Related Materials 66 (2016) 36-46) provides an analysis of single crystal diamond substrates grown in a pocket substrate holder via a microwave plasma activated chemical vapour deposition (MPACVD) technique. In the described approach, a pocket or recessed holder is designed to hold a single diamond substrate with the sides of the holder located close to the sides of the single diamond substrate (within 0.5 to 1 mm). This configuration is intended to prevent any polycrystalline CVD diamond growth around the single crystal diamond substrate within the recess with the aim of producing single crystal CVD diamond plates which lower stress. Thin plates of single crystal CVD diamond where produced in a single step growth process and having a thickness of less than 0.5 mm. A larger single crystal CVD diamond cube of 2.3×2.5× 2.7 mm$^2$ was also grown in a single step CVD growth process using such a pocket substrate holder. This approach differs from that described in WO2004027123 in that: (i) it is a single stage CVD growth process rather than a multi-stage CVD growth process; (ii) a relatively, thin, small, single crystal CVD diamond product is achieved; and (iii) the pocket holder is small (approximately 4 mm×4 mm×2 mm) and designed to be located in close proximity to the sides of the single crystal diamond substrate to inhibit polycrystalline CVD diamond growth around the single crystal diamond substrate whereas in WO2004027123 polycrystalline CVD diamond growth occurs and the single crystal diamond substrate is transferred into a larger recess for subsequent growth with a 25 mm disc of the surrounding polycrystalline CVD diamond.

Wu et al. (Diamond & Related Materials 66 (2016) 144-151) describe the influence of recess depth and crystallographic orientation of seed sides on homoepitaxial growth of CVD single crystal diamonds. This document is similar to Nad & Asmussen in that it teaches: (i) a single stage CVD growth process; (ii) a relatively, thin, small, single crystal CVD diamond product; and (iii) the use of a pocket holder with a small recess of depth approximately 1 mm and side walls located in close proximity to the sides of the single crystal diamond substrate to inhibit polycrystalline CVD diamond growth around the single crystal diamond substrate.

SUMMARY OF INVENTION

None of the approaches summarized in the background section of the present specification provide a commercially viable route to the fabrication of large/thick single crystal CVD diamonds. As such, it is an aim of embodiments of the present invention to provide such a commercially viable route to the fabrication of large/thick single crystal CVD diamonds.

According to the present invention there is provided a method of fabricating a plurality of single crystal CVD diamonds, the method comprising:
  mounting a plurality of single crystal diamond substrates on a first carrier substrate;
  subjecting the plurality of single crystal diamond substrates to a first CVD diamond growth process to form a plurality of single crystal CVD diamonds on the plurality of single crystal diamond substrates;
  mounting the plurality of single crystal CVD diamonds in a recessed carrier substrate; and
  subjecting the plurality of single crystal CVD diamonds to a second CVD diamond growth process.

The aforementioned method allows a plurality of large, thick, high quality single crystal CVD diamonds to be manufactured in a commercially viable manner. The approach differs from the prior art methods described in the background section of this specification in that it requires at least two CVD diamond growth processes including a first CVD diamond growth process to fabricate a plurality of single crystal CVD diamond and a second CVD diamond growth process which utilizes a recessed carrier substrate having a recess which is sufficiently large to receive the plurality of single crystal CVD diamonds. Unlike the prior art documents which require a pocket recess configured to receive a single diamond substrate with side walls of the pocket located in close proximity to the single diamond substrate, surprisingly it has been found that even when using a larger recess in which a plurality of single crystal CVD diamonds are disposed, the use of such a recessed carrier substrate still aids in maintaining control of the top surface of the single crystal CVD diamonds as they grow. Recessing a plurality of diamonds in this manner still lowers the effective height of the diamond relative to the plasma. What is surprising is that while the larger recess does not shield the four non-growth sides of each single crystal CVD diamond in the same manner as a small pocket recess, thick growth is controlled and maintained in a stable manner. It is thought that this is because by providing a plurality of single crystal CVD diamond within the recess, the four non-growth sides of each single crystal CVD diamond are shielded by the neighbouring single crystal CVD diamonds within the recess such that the plurality of single crystal CVD diamonds effectively present only a single growth face to the plasma.

BRIEF DESCRIPTION OF THE DRAWINGS

For a better understanding of the present invention and to show how the same may be carried into effect, embodiments of the present invention will now be described by way of example only with reference to the accompanying drawings, in which.

DETAILED DESCRIPTION

Figure 1:
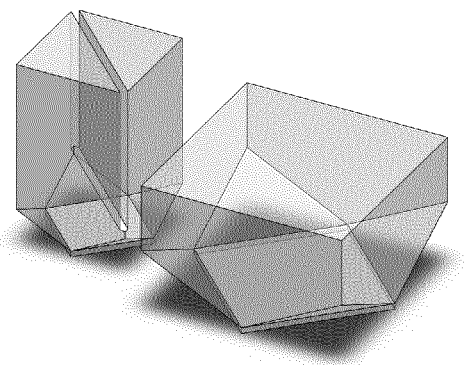
FIG. 1 illustrates a thick single crystal CVD diamond which has been vertically sliced along a diagonal and used as a substrate for further CVD diamond growth.

As described in the summary of invention section of this specification, a method of fabricating a plurality of single crystal CVD diamonds is provided which comprises:
  mounting a plurality of single crystal diamond substrates on a first carrier substrate;
  subjecting the plurality of single crystal diamond substrates to a first CVD diamond growth process to form a plurality of single crystal CVD diamonds on the plurality of single crystal diamond substrates;
  mounting the plurality of single crystal CVD diamonds in a recessed carrier substrate; and
  subjecting the plurality of single crystal CVD diamonds to a second CVD diamond growth process.

The first carrier substrate is usually a planar substrate such that the first CVD diamond growth process is a relatively conventional one. The aim of the first CVD diamond growth process is to grow single crystal CVD diamonds to a thickness which is possible using a conventional approach and the growth process is terminated prior to losing control of the top surface of the single crystal CVD diamonds as they grow into the overlying plasma.

Typically, the first CVD diamond growth process is run until the single crystal CVD diamonds have a thickness in a range 3 to 8 mm. Growing to such thicknesses and, for example, utilizing {100} oriented substrates and low and controlled nitrogen concentrations in the gas phase as described for example in U.S. Pat. No. 7,740,824, the first CVD diamond growth process produces single crystal CVD diamonds which comprise a rotation layer and a layer disposed on the rotation layer. Such a rotational structure is known in the art. In the initial phase of single crystal CVD diamond growth the crystals grow both laterally and vertically and the top face of each crystal rotates by 45°. After the initial rotation phase each crystal grows vertically with substantially no lateral growth.

After the first CVD diamond growth process, it is advantageous to remove the rotation layer prior to mounting the single crystal CVD diamonds in the recessed carrier substrate for the second CVD diamond growth process. Removing the rotation layer increases the area of the base of each single crystal CVD diamond and thus improves thermal contact of the single crystal CVD diamonds to the recessed carrier substrate during the second CVD diamond growth process. This improvement in thermal contact aids in controlling the temperature of the single crystal CVD diamonds as they grow towards the plasma and thus aids in maintaining good quality single crystal CVD diamond growth as the crystals grow to higher thicknesses.

It has also been found to be advantageous to process and mount the single crystal CVD diamonds in the recessed carrier substrate for the second CVD diamond growth process such that their upper surfaces are located at the same height to within ±300 micrometres, ±250 micrometres, ±200 micrometres, ±150 micrometres, ±100 micrometres, ±50 micrometres, or ±20 micrometres. This can be particularly important when growing very thick single crystal CVD diamonds as it becomes increasingly difficult to maintain control of single crystal growth and small variations in the height of the growth face of the single crystal CVD diamonds can lead to a proportion of the crystals falling outside a narrow parameter space for stable crystal growth as they get thicker. While conventionally single crystal diamond substrates are mounted nominally at the same height for a CVD diamond growth process, in practice variations in height occur due to variations in the thickness of the substrates and also variations in the thickness of adhesives such as metal braze or solder which are utilized to adhere the single crystal diamond substrates to the carrier substrate. For growth of relatively thin layers of single crystal CVD diamond, small variations in height are acceptable. However, it has been found that for very thick growth, tighter control on height variations is required. Furthermore, since the single crystal CVD diamonds have already undergone a first CVD diamond growth process prior to mounting them in the recessed carrier substrate, they may not fit within a tight thickness threshold and thus require careful processing to ensure that the their upper surfaces are located at the same height to within ±300 micrometres, ±250 micrometres, ±200 micrometres, ±150 micrometres, ±100 micrometres, ±50 micrometres, or ±20 micrometres. The processing may comprise polishing of the growth face of each single crystal CVD diamond prior to the second CVD diamond growth process. Furthermore, the single crystal CVD diamonds can be subjected to an etch step after mounting in the recessed carrier substrate to remove any processing damage prior to the second CVD diamond growth process.

In addition to carefully controlling the height of the plurality of single crystal CVD diamonds, the lateral spacing between the individual single crystal CVD diamonds (i.e. packing density) within the recessed carrier substrate is also important. As previously indicated, it is thought that by providing a plurality of single crystal CVD diamonds within the recess, the four non-growth sides of each single crystal CVD diamond are shielded by the neighbouring single crystal CVD diamonds within the recess such that the plurality of single crystal CVD diamonds effectively present only a single growth face to the plasma. As such, the single crystal CVD diamonds must be sufficiently close to each other that this shielding effect is achieved while being sufficiently spaced apart that adjacent crystals do not grow together causing defective growth. Because the single crystal CVD diamonds have already undergone lateral growth and rotation during the first CVD diamond growth process and the rotation layer has been removed, lateral growth in the second CVD diamond growth process is minimal and thus the single crystal CVD diamonds can be packed together more closely. For example, the single crystal CVD diamonds may be mounted in the recessed carrier substrate such that the distance between each of the single crystal CVD diamonds is in a range 0.5 to 4.0 mm. Between nine and one hundred single crystal CVD diamonds may be mounted in the recessed carrier substrate in this manner and subjected to the second CVD diamond growth process.

The recessed carrier substrate typically comprises a single recess in which the plurality of single crystal CVD diamonds are mounted. According to one configuration, the recessed carrier substrate comprises two parts including a base on which the plurality of single crystal CVD diamonds are mounted and a surround which forms the recess above the base in which the plurality of single crystal CVD diamonds are disposed. The base and the recess can be configured such that the base is not in contact with the surround for the second CVD diamond growth process. This configurations aids independent temperature control of the base and surround. Furthermore, during the second CVD diamond growth process polycrystalline CVD diamond grows on the recessed carrier substrate around the recess and the temperature of the polycrystalline CVD diamond can be controlled such that a vertical growth rate of the single crystal CVD diamonds and a vertical growth rate of the polycrystalline CVD diamond is the same to within ±5 micrometres/hr, ±4 micrometres/hr, ±3 micrometres/hr, ±2 micrometres/hr, or ±1 micrometres/hr. This enables the polycrystalline CVD diamond and the single crystal CVD diamonds to effectively present a single growth face to the plasma and aids thermal management and uniformity of growth.

The second CVD diamond growth process can be run to produce single crystal CVD diamonds which have a thickness in a range 8 mm to 20 mm. These single crystal CVD diamonds can then be processed into products or into large area single crystal diamond substrates for further single crystal CVD diamond growth. For example, the thick crystals can each be vertically sliced into a plurality of single crystal diamond plates which can be used for optical applications, heat spreaders, or substrates for further CVD diamond growth. Alternatively, the single crystal CVD diamonds can be removed from the recessed carrier substrate after the second CVD diamond growth process, re-mounted in another recessed carrier having a deeper recess, and subjected to a third CVD diamond growth process to further increase the thickness of the plurality of single crystal CVD diamonds.

The methodology as described here provides a commercially viable way of producing significant numbers of large (>12 mm dimension) single crystal diamond substrates by mounting a number of single crystal CVD diamonds at once into a recess and relying on the single crystal CVD diamonds to mutually shield each other from the plasma. The single crystal CVD diamonds may be recessed more than once in order to achieve single crystal CVD diamonds which are very thick. These single crystal CVD diamonds may then be vertically cut along the diagonal in order to obtain a very large <100>-edged substrate, which can be used to seed further generations.

As previously indicated, experiments have shown that it is advantageous to remove the rotation stage before the recessing stages, in order to improve temperature control by decreasing the area ratio between the growth and braze surfaces and hence improving the heat sinking capacity of the reactor stack. It is also possible to pack such processed diamonds more tightly in the recessed carrier with the diamonds more closely spaced thus providing better shielding of side surfaces of the diamonds.

A typical process comprises the following steps (indicating dimensions of the single crystal diamond before and after each CVD diamond growth stage):

Stage 1: 6.5×6.5×0.5->9.2×9.2×6 mm$^3$

Remove rotation stage and recess diamonds.

Stage 2: 9.2×9.2×6 mm$^3$->9.2×9.2×13 mm$^3$

Vertically cut 12×12×0.5 mm$^3$ substrate from the diagonal of each diamond.

Stage 3: 12×12×0.5->16×16×6.5

Remove rotation stage, recess diamonds, etc.

This sequence may be repeated for several generations. Stages two and three are illustrated in FIG. 1.

Figure 2:
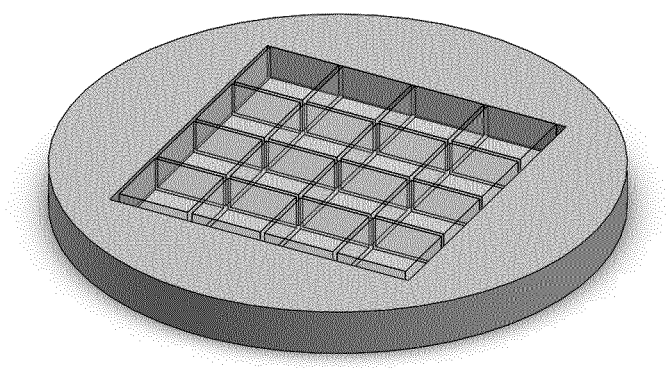
FIG. 2 illustrates an example of a tightly-packed recessed loading.

As previously indicated, the loading configuration can be critical: diamonds are required to be in close enough proximity for the mutual shielding to be effective (e.g. <2 mm distance between diamonds). Additionally, the current understanding requires the design of the outer guard surface to be highly matched to the loading pattern. A 120 mm outer diameter recess shield loaded with 16×16 mm diamonds is shown in FIG. 2 as an example of a tightly-packed recessed loading.

Experiments have also shown that the process is sensitive to the height of the diamonds above or below the recessed carrier substrate. Initial heights below the upper surface of the carrier substrate of >2 mm prove problematic. Heights significantly above the upper surface of the carrier substrate encounter similar problems to thick non-recessed growth i.e. loss of thermal control.

Figure 3:
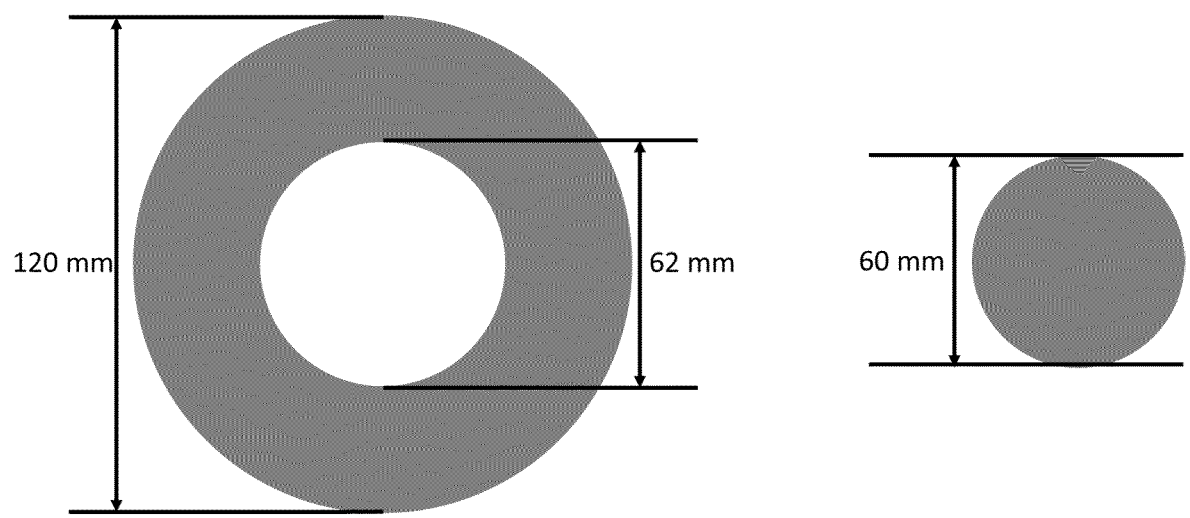
FIG. 3 illustrates a recessed carrier substrate system including a circular recessed carrier and a ring shaped recessing plate.

The recessed carrier substrate used in this work comprises two parts: (1) a recessing plate which holds off the plasma from the diamond; and (2) a recessed carrier to which the single crystal diamonds are brazed. The recessed carrier substrate may comprise a 120 mm tungsten carrier with a square hole cut in its' centre as the recessing plate. A tungsten square can then be used as the recessed carrier. However, this design suffers from a number of problems. In particular, it is desirable to coat the recessed carrier with a layer of polycrystalline CVD diamond prior to brazing the single crystal CVD diamonds to the recessed carrier. A square shaped recessed carrier is difficult to coat. As such, this design has now been superseded by an all circular design where the recessing plate is made of molybdenum and only the recessed carrier is made of tungsten. FIG. 3 shows the current recessed carrier design. A selection of recessing plates are available with different thicknesses.

The current recessed carrier design can be placed directly in a CVD chamber for coating with polycrystalline CVD diamond. The molybdenum recessing plate does not need to be coated with polycrystalline CVD diamond in order to make the system work. However, coating the recessing plate can enable the polycrystalline CVD diamond on the recessing plate to grow faster during the single crystal synthesis phase and aids in shielding the single crystal CVD diamonds allowing thicker growth. The selection of molybdenum for the recessing plate was motivated by the lower cost of developing new designs as it is more readily machined when compared to tungsten. However, a tungsten recessing plate can also be used.

When brazing single crystal CVD diamonds to the recessed carrier it can be difficult to align the braze pads properly with the bottom of the diamonds. This problem arises because the high packing density makes it easy to nudge the diamonds and because it is difficult to see the position of the braze pads underneath the diamonds. Poor brazing can lead to the loss of temperature control. One way to remedy this issue is to use much large braze pads which cannot, in effect, be misaligned or wrongly positioned. It should also be noted that all the diamonds must be positioned away from the edges of the carrier to ensure that the recessed carrier with mounted diamonds will fit in the recessing plate.

Figure 4:
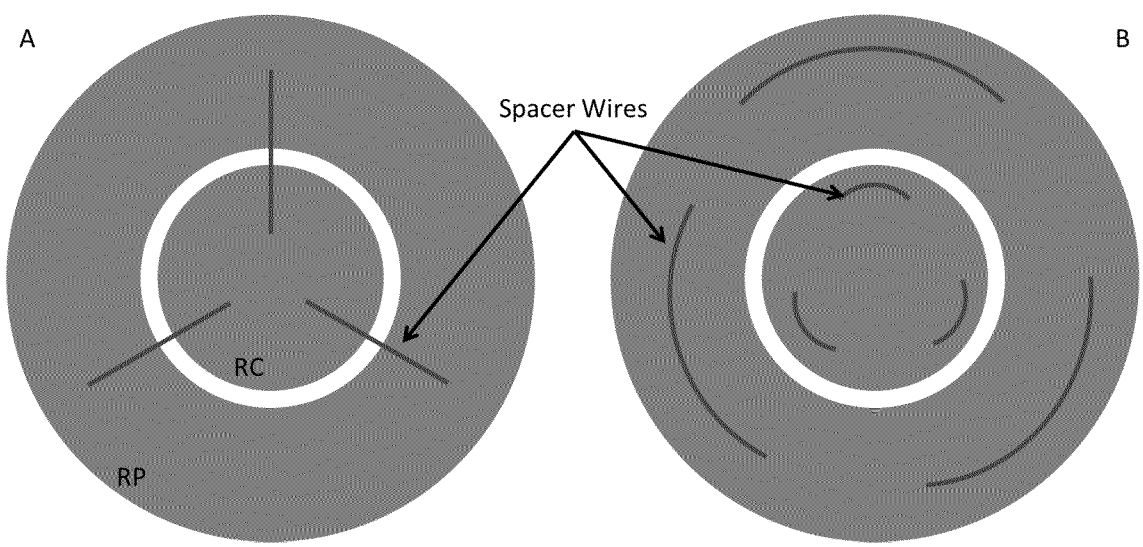
FIGS. 4(a) and 4(b) show two different spacer configurations for the recessed carrier substrate system shown in FIG. 3.

The recessed carrier substrate configuration can be mounted in a CVD reactor on a support surface within the reactor. The recessed carrier substrate configuration can be spaced apart from the support surface using spacer wires as is known in the art to aid temperature control. One spacer wire configuration is illustrated in FIG. 4(a). This configuration ensures that the recessing plate is not lower than the recessed carrier which can prevent a free flow of gas under the recessing plate and force gas up the sides of the recessed carrier cooling the edge diamonds during growth. This configuration has worked in that good quality long growths have been realised and has not resulted in arcing under the carrier. However, another possibility as shown in FIG. 4(b) allows the recessing plate and the recessed carrier to be mounted at different heights by using different thicknesses of spacer for the recessing plate and the recessed carrier. For example, thicker spacer wires can be used for the recessing plate which will increase its temperature compared to the recessed carrier during CVD diamond growth. This approach can be used to control the rate of growth of polycrystalline CVD diamond on the recessing plate and tune this growth rate to that of the single crystal CVD diamonds to aid shielding and allow thicker single crystal growth.

Thermal control is a primary concern in this process. As previously indicated, thermal control can be improved by lapping away or laser slicing the rotation layer from the single crystal CVD diamonds prior to mounting in the recessed carrier system. The primary purpose of this processing is to increase the footprint of each diamond to approximately that of the top face of the diamonds. This gives a better thermal path from the growth surface of the diamonds to the carrier and improves surface temperature control. An additional advantage of processing to remove the rotation layer is that it aids in ensuring that all diamonds in the recess are of the same thickness and allows control of the height that the diamonds protrude from the recess at the start of growth. This means that one can, in principle, use diamonds from a number of sources easing material supply issues.

The diamonds should be selected such that they have a large growth face with respect to the parent substrate, with good clean edges. Once large 113's have formed on a diamond during growth they are difficult to grow back out. This also means that if the feeder diamonds have large 113's they may never be recovered to their full face size. The diamonds should be selected so that they are of a uniform thickness and such that the diamond surface is approximately 100 µm proud of the recess. It is usually desired to grow on top of the thickest available feeder diamonds.

CVD diamond growth conditions will depend on the desired product characteristics. However, a growth process which uses low and controlled nitrogen concentrations in the gas phase, as described for example in U.S. Pat. No. 7,740,824, has been found to be effective.

Substrate temperature during CVD diamond growth can be monitored using a pyrometer or via observation of the top-face morphology of the diamonds to determine whether the temperature is correct for the desired growth process. Temperature can be corrected using table gas under the carrier substrate as is known in the art.

Thin, typically 150 µm, spacer wires are favoured for the carrier mounting. This gives superior cooling and allows control of a growth run to at least 620 hours of growth. Additionally, non-conventional table gas mixtures can be used in order to increase temperatures during the etching phase and to cool the diamonds in the later growth phase. Cracking of the single crystal CVD diamonds during recessed growth can be alleviated through the introduction of long etch phases at the start of the recessed run. The use of a 4 hour oxygen etch and a 1 hour hydrogen etch is sufficient and does not negatively affect the growth interface. Additionally, a $CH_4$ ramp can be used after the etch phase.

Due to the un-conventional table gas mixtures used during the etch phase to keep the temperatures up, the temperature can be ramped down to the desired growth temperature while the $CH_4$ ramp is being performed. Due to the sensitivity of the process, all temperature changes should be gradual. It is better to change the temperature over a number of hours than over minutes. The underlying strategy is to actively manage the morphology of the diamond between too hot and too cold. There should be a slight preference toward too cold because too hot will result in lost top-face which cannot be recovered and the material quality need only be good enough for use in substrates. All of this said, the diamonds will tend to get hotter as they grow toward the plasma and the operator will typically need to edge the temperature downwards most of the time and only occasionally increase the temperature.

Advantageously, the process is monitored daily. It is from the observation of small changes that control of this growth process is maintained. Furthermore, over compensation to account for changes during growth should be avoided. Again, slow incremental changes have produced the best results.

In summary, the deployment of single crystal diamond in industrial and technological applications is limited by the crystal sizes available. For example, many applications are unfeasible at sizes of 8×8 mm. A commercially viable route to fabricating larger, high quality, single crystal CVD diamond products (e.g. 16×16 mm) as described herein is seen as enabling in various markets, allowing the production of higher power solid state disc lasers and other high power density devices.

The work leading to this invention has received funding from the European Union's Seventh Framework Programme (FP7/2007-2013) under grant agreement no. 619177.

While this invention has been particularly shown and described with reference to embodiments, it will be understood to those skilled in the art that various changes in form and detail may be made without departing from the scope of the invention as defined by the appending claims.

The invention claimed is:

1. A method of fabricating a plurality of single crystal CVD diamonds, the method comprising:
   mounting a plurality of single crystal diamond substrates on a first carrier substrate;
   subjecting the plurality of single crystal diamond substrates to a first CVD diamond growth process to form a plurality of single crystal CVD diamonds on the plurality of single crystal diamond substrates;
   mounting the plurality of single crystal CVD diamonds in a single recess in a recessed carrier substrate; and
   subjecting the plurality of single crystal CVD diamonds to a second CVD diamond growth process.

2. The method according to claim 1, wherein the first carrier substrate is a planar substrate.

3. The method according to claim 1, wherein the first CVD diamond growth process is run until the single crystal CVD diamonds have a thickness in a range 3 to 8 mm.

4. The method according to claim 1, wherein the first CVD diamond growth process produces single crystal CVD diamonds which comprise a rotation layer and a layer disposed on the rotation layer.

5. The method according to claim 4, wherein the rotation layer is removed prior to mounting the single crystal CVD diamonds in the recessed carrier substrate to improve thermal contact of the single crystal CVD diamonds to the recessed carrier substrate during the second CVD diamond growth process.

6. The method according to claim 1, wherein the single crystal CVD diamonds are processed and mounted in the recessed carrier substrate such that upper surfaces of the single crystal CVD diamonds are located at the same height to within ±300 micrometres.

7. The method according to claim 1, wherein the single crystal CVD diamonds are mounted in the recessed carrier substrate such that a distance between each of the single crystal CVD diamonds is in a range 0.5 to 4 mm.

8. The method according to claim 1, wherein between 9 and 100 single crystal CVD diamonds are mounted in the recessed carrier substrate and subjected to the second CVD diamond growth process.

9. The method according to claim 1, wherein the single crystal CVD diamonds are subjected to an etch step after mounting in the recessed carrier substrate and prior to the second CVD diamond growth process.

10. The method according to claim 1, wherein the recessed carrier substrate comprises two parts including a base on which the plurality of single crystal CVD diamonds are mounted and a surround which forms the single recess above the base in which the plurality of single crystal CVD diamonds are disposed.

11. The method according to claim 10, wherein the base and the single recess are configured such that the base is not in contact with the surround for the second CVD diamond growth process.

12. The method according to claim 1, wherein during the second CVD diamond growth process, polycrystalline CVD diamond grows on the recessed carrier substrate around the single recess and a temperature of the polycrystalline CVD diamond is controlled such that a vertical growth rate of the single crystal CVD diamonds and a vertical growth rate of the polycrystalline CVD diamond is the same to within ±5 micrometres/hr.

13. The method according to claim 1, wherein the second CVD diamond growth process produces single crystal CVD diamonds which have a thickness in a range 8 mm to 20 mm.

14. The method according to claim 1, wherein the single crystal CVD diamonds are removed from the recessed carrier substrate after the second CVD diamond growth process, re-mounted in another recessed carrier having a deeper recess, and subjected to a third CVD diamond growth process to further increase a thickness of the plurality of single crystal CVD diamonds.

* * * * *